United States Patent
Wang et al.

(10) Patent No.: US 10,116,892 B1
(45) Date of Patent: Oct. 30, 2018

(54) BITLINE BOOST FOR FAST SETTLING WITH CURRENT SOURCE OF ADJUSTABLE BIAS

(71) Applicant: OmniVision Technologies, Inc., Santa Clara, CA (US)

(72) Inventors: Rui Wang, San Jose, CA (US); Hiroaki Ebihara, San Jose, CA (US)

(73) Assignee: OmniVision Technologies, Inc., Santa Clara, CA (US)

(*) Notice: Subject to any disclaimer, the term of this patent is extended or adjusted under 35 U.S.C. 154(b) by 0 days.

(21) Appl. No.: 15/853,487

(22) Filed: Dec. 22, 2017

(51) Int. Cl.
  *H04N 5/235* (2006.01)
  *H04N 5/374* (2011.01)
  *H01L 27/146* (2006.01)
  *H04N 5/378* (2011.01)

(52) U.S. Cl.
  CPC ....... *H04N 5/378* (2013.01); *H01L 27/14643* (2013.01); *H04N 5/2355* (2013.01); *H04N 5/3742* (2013.01)

(58) Field of Classification Search
  None
  See application file for complete search history.

(56) References Cited

U.S. PATENT DOCUMENTS

| 9,549,135 B2 * | 1/2017 | Kito ...... H04N 5/378 |
|---|---|---|
| 2015/0208008 A1 | 7/2015 | Gendai | |

* cited by examiner

Primary Examiner — Mark T Monk

(57) ABSTRACT

A photodiode is adapted to accumulate image charges in response to incident light. The accumulate image charges are transferred to a floating diffusion, amplified, row selected and the amplified row selected signal is output to a bitline. A bitline enable transistor is coupled to link between the bitline and a bitline source node. A current source is coupled to connect between the bitline source node and a ground. The current source generator sinks adjustable current from the bitline source node to the ground through a cascode transistor and a bias transistor. A cascode hold capacitor is coupled between the cascode control voltage and the ground. A bias hold capacitor is coupled between the bias control voltage and the ground. A bias boost driver is coupled to control the cascode control voltage and the bias control voltage.

42 Claims, 4 Drawing Sheets

BITLINE BOOST FOR FAST SETTLING WITH CURRENT SOURCE OF ADJUSTABLE BIAS

TECHNICAL FIELD

This disclosure relates generally to Complementary Metal-Oxide-Semiconductor (CMOS) image sensors, and in particular but not exclusively, relates to apparatus and method applied to photodiode pixel cells and their output line (bitline) in image sensor that is capable of fast settling the bitline during the readout of the image signal to reduce fixed pattern noise (FPN) and to maintain stability of the supply power.

BACKGROUND INFORMATION

Image sensors have become ubiquitous. They are widely used in digital still cameras, cellular phones, security cameras, as well as medical, automobile, and other applications. High dynamic range (HDR) image sensors have been required by many of those applications. Human eyes normally possess a dynamic range of up to about 100 dB. For automobile applications, an image sensor of more than 100 dB dynamic range to deal with different driving conditions, such as driving through a dark tunnel into bright sunlight, is often required.

HDR image sensors do not always perform HDR functions properly. Common drawbacks include image degradation due to fixed pattern noise (FPN), large random noise, reduced resolution associated with charge blooming, motion artifacts, fixed sensitivity, and lower fill factor when multiple photodiodes are used, where fill factor is a ratio of a pixel's light sensitivity area to its total area.

When image sensors are used, photo-generated electrons in each of the plurality of pixel cells are transferred from the photodiode (PD) to the floating diffusion (FD) for subsequent readout. The transfer (TX) transistor coupled between the PD and the FD is switched on and off under the control of a voltage pulse asserted to the TX gate terminal to enable this charge transfer. Due to an always-presented coupling capacitance between the TX gate terminal and the FD, the pulse signal asserted on the TX gate is always largely coupled to the FD. This is called TX feed-through. It ripples through a source follower (SF) transistor and a row select (RS) transistor to an output line, also called a bitline, of the pixel cell. Such a propagation of a large unwanted pulse is unavoidable and causes annoying FPN even for dark signals (which are signals caused by non-photo-generated, intrinsic electrons inside the pixel). For any given bitline, since it connects to all the pixels in the column, it possesses a significant amount of capacitive and resistive (RC) load. Therefore, any state changes on the bitline are unavoidably slow due to this RC delay. That is, once a status changes happen on the bitline, it takes a long time to settle to the newly updated step level. This is governed by the so-called RC time constant. For any given input step Vin, its settling time is governed by $$t_{settle} = \tau \cdot \ln \frac{V_{in}}{V_{0.5 LSB}},$$

where time constant $\tau = RC$, and $V_{0.5LSB}$ is half the value of a single bit equivalent voltage.

One of the typical solutions to resolve this is to clamp the bitline voltage to limit its swing by using a clamp voltage generator. It helps suppressing the high-light-banding represented by voltages near its lower end. The goal is achieved by not allowing the bitline to drop below the clamped voltage limit. As a result, it reduces FPN under the high lighting conditions. However, this solution causes a large current variation to the power supply in react to each step voltage changes which in turn induces other unwanted performance issues on the sensor.

Another solution is to disconnect the pixel cell from its output line (bitline) during the charge transfer, also with the help of an added clamp voltage generator. The clamp voltage generator does not allow the bitline voltage to drop below a certain voltage level. Therefore, when the charge transfer takes place, the voltage change on bit lines can be reduced and settling time can be shortened. In addition, the total power supply (AVDD) current is maintained near constant by the clamp voltage generator to avoid large variations on the power supply. With this solution, after the RS transistor is switched back on again to reconnect the pixel output to the bitline, under complete dark condition which is correlated to the highest voltage, the bitline is charged by a pull-up-current through the SF transistor instead of being sunk by a pull-down-current of a relatively weak current source generator. Settling time is also reduced because the SF current is not limited by the current source generator. A faster pull up is always reached. That means, a faster settling on low lighting condition is clearly favored for this solution. Nevertheless, performance on strong lighting condition is still a problem, since higher contrasts in light intensities involve larger voltages drops on bitline which directly leads to a longer settling time.

Some solutions may offer decent result. However, they may involve fairly complex circuit such as amplifiers and controllers which occupy a lot of additional silicon area for each column readout circuit, and consumes more power to execute.

What's more, as size of pixel gets smaller and with higher conversion gains utilized, the FD capacitance may get so small that the TX feed-through may easily go beyond the range of the analog-to-digital converter (ADC) input voltage.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
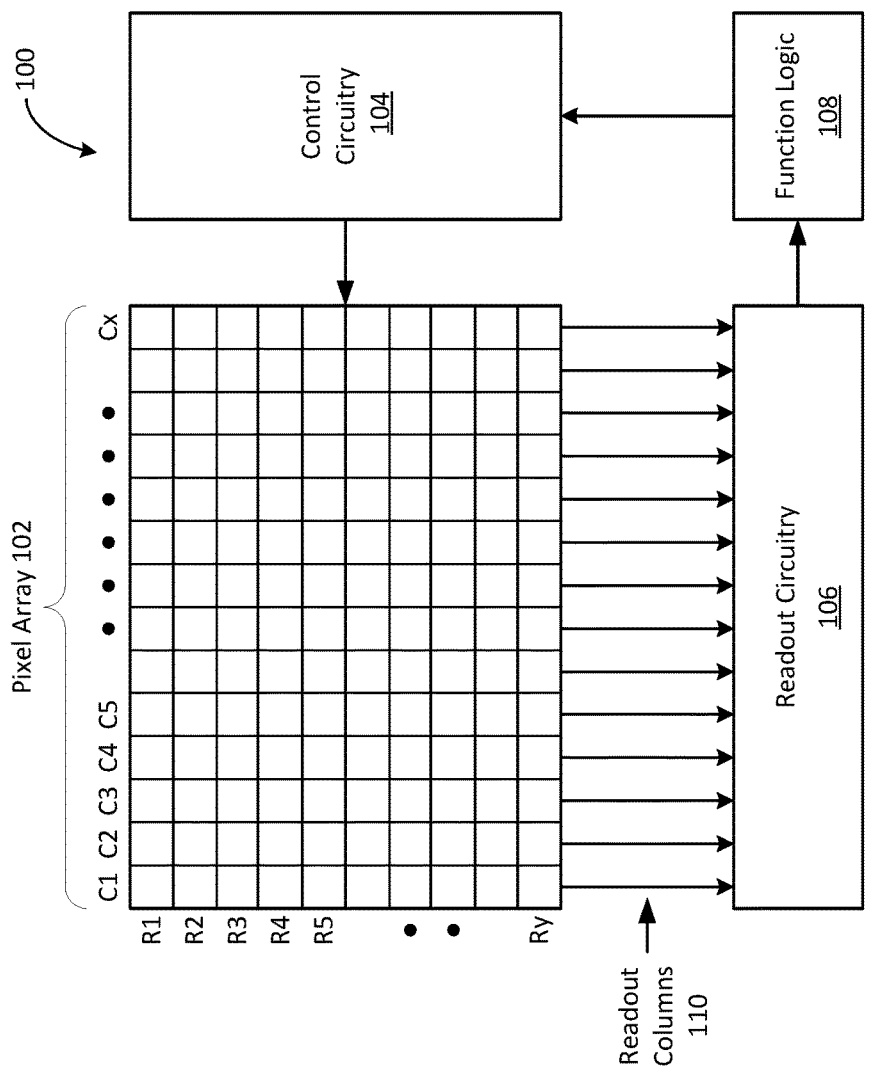
FIG. 1 illustrates one example of an imaging system in accordance with an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Embodiments of an apparatus and method for a fast settling pixel output line in an imaging sensor are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise.

FIG. 1 illustrates one example of an imaging system 100 in accordance with an embodiment of the present disclosure. Imaging system 100 includes pixel array 102, control circuitry 104, readout circuitry 106, and function logic 108. In one example, pixel array 102 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 102 has acquired its image charge through photo-generation of the image charge, corresponding image data is readout by readout circuitry 106 and then transferred to function logic 108. Readout circuitry 106 may be coupled to readout image data from the plurality of photodiodes in pixel array 102. In various examples, readout circuitry 106 may include amplification circuitry, analog-to-digital (ADC) conversion circuitry, or otherwise. In one example, readout circuitry 106 may readout a row of image data at a time along readout column lines 110 (illustrated) or may readout the image data using a variety of other techniques (not illustrated), such as a serial readout or a full parallel readout of all pixels simultaneously. Function logic 108 may store the image data or even manipulate the image data by applying post image effects (e.g., crop, rotate, remove red eye, adjust brightness, adjust contrast, or otherwise).

In some embodiments, function logic 108 may require certain imaging conditions to be met and may therefore instruct the control circuitry 104 to manipulate certain parameters in pixel array 102 to achieve better qualities or special effects.

Figure 2:
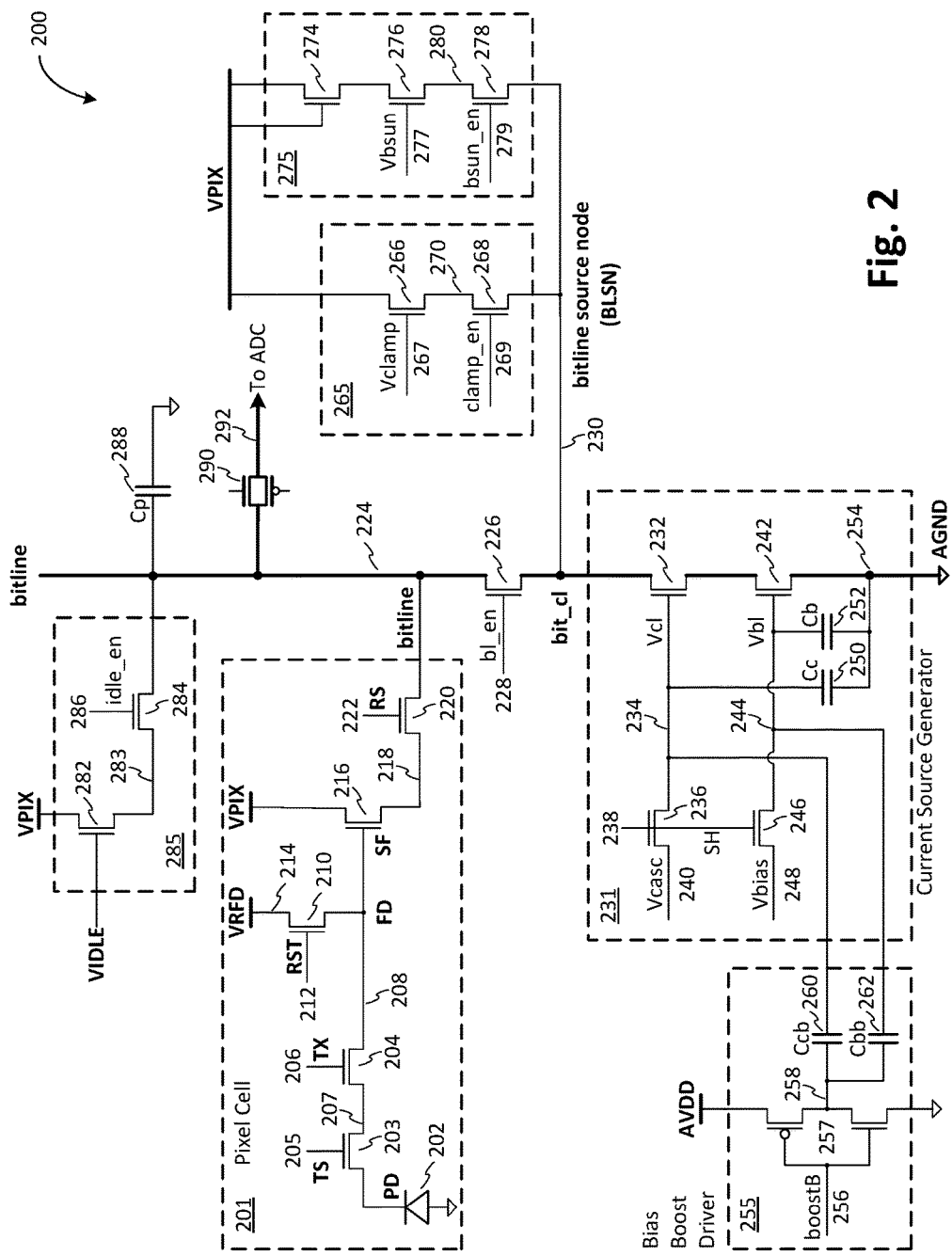
FIG. 2 is an example schematic of a block diagram of a pixel cell and pixel output circuit in an imaging sensor that is capable of fast settling in its bitline in accordance with an embodiment of the present disclosure.

FIG. 2 is one example of block diagram of a pixel cell and pixel output circuit in an imaging sensor that is capable of fast settling on its output line, bitline 224, in accordance with an embodiment of the present disclosure. The illustrated embodiment of image sensor system 200 may comprise a detecting photodiode (PD) 202 in a typical 4 transistor (4T) pixel cell 201, where the 4t portion may include a transfer (TX) transistor 204, a reset (RST) transistor 210, a source follower (SF) transistor 216, and a row select (RS) transistor 220. In one embodiment, the RS transistor 220 is connected between the source terminal of the SF transistor 216 and the bitline 224, the drain terminal of the SF transistor 216 is connected to a pixel voltage (VPIX) directly, as shown in FIG. 2. In another embodiment, the RS transistor 220 is connected between the drain terminal of the SF transistor 216 and the VPIX. The VPIX may be connected to a power supply voltage AVDD, or may be connected to a regulated voltage supply, where the regulated voltage supply is regulated based on the supply from the AVDD. The node where the drain of the TX transistor 204, the source of the RST transistor 210, and the gate of the SF transistor 216 meet is a floating diffusion (FD) 208. A reset (RST) gate voltage 212 and a RS gate voltage 222 which are under the control of the control circuitry 104 (see FIG. 1) enable conductions of the RST transistor 210 and the RS transistor 220, respectively.

The TX transistor 204 is enabled by a transfer (TX) gate voltage 206. The TX transistor 204 can be switched on when a high connect voltage is asserted to the TX gate voltage 206, under which, in one embodiment, the photodiode (PD) 202 is connected to the TX receiving terminal 207 of the TX transistor 204 directly, the photo-generated signal charges accumulated at the PD 202 can be transferred to the FD 208 through the TX transistor 204. In another embodiment, the stored charges presented at the TX receiving terminal 207 of the TX transistor 204 which are transferred by the transfer storage (TS) transistor 203 from the PD 202 may be transferred to the FD 208 through the TX transistor 204. The TX transistor 204 can be switched off when a low enough disconnect voltage is asserted to the TX gate voltage 206.

The amplified image signal from the source terminal of the SF transistor 216 is delivered to the bitline 224 when the RS transistor 220 is switched on when the RS gate voltage 222 is set to high. The analog image signal on the bitline 224 is eventually presented to an input terminal of an ADC. In one embodiment, such an ADC is one of the pluralities of ADCs coupled to each bitlines, or readout columns 110 as shown in FIG. 1, when a corresponding transmission gate 290 is enabled.

A bitline enable transistor 226 connects between the bitline 224 and a bitline source node (BLSN) 230. When a bitline enable voltage, bl_en 228, is set to high, the bitline enable transistor 226 is switched on, and the bitline 224 is connected to the current source (CS) generator 231 through the BLSN 230.

The CS generator 231 connects between the BLSN 230 and an analog ground (AGND). The CS generator 231 provides adjustable current to the BLSN 230 by two serially connected transistors: a cascode transistor 232 and a bias transistor 242. The cascode transistor 232 is controlled by a cascode control voltage, Vcl 234. The bias transistor 242 is controlled by a bias control voltage, Vbl 244.

An appropriate cascode control voltage Vcl 234 is need for normal operation of the CS generator 231 and is conditioned by a voltage Vcasc 240 when the sample and hold (SH) voltage 238 is set to high to close a cascode enable transistor 236. When the SH voltage 238 is high, a cascode hold (CH) capacitor 250 is charged to Vcasc 240. The CH capacitor 250 holds the value of Vcasc 240 till the next SH pulse 238 comes and the value of Vcl 234 on the CH capacitor 250 is refreshed to the exact value of Vcasc 240 again at that point. Since the CH capacitor 250 is coupled between the cascode control voltage Vcl 234 and the analog ground AGND 254, Vcl 234 discharges slowly and its value drops a little before the subsequent SH pulse 238 arrvies. Both Vcasc 240 and the SH pulses 238 are controlled by the control circuit 104.

An appropriate bias control voltage 244 is also need for normal operation of the CS generator 231 and is conditioned by a voltage Vbias 248 when the SH voltage 238 is set to high to close a bias enable transistor 246. When the SH voltage 238 is high, a bias hold (BH) capacitor 252 is charged to the Vbias 248. The BH capacitor 252 holds the value of Vbias 248 till the next SH pulse 238 comes and the value Vbl 244 on the BH capacitor 252 is refreshed to the exact value of Vbias 248 again at that point. Since the bias BH capacitor 252 is coupled between the bias control voltage Vbl 244 and AGND 254, Vbl 244 discharges slowly and its value drops a little before the subsequent SH pulse 238 arrives. Vbias 248 is controlled by the control circuit 104.

The cascode control voltage 234 and the bias control voltage 244 are both controlled by the output of a bias boost driver 255. The bias boost driver 255 receives control from a boost enable signal 256 and provides boost voltages to the cascode transistor 232 and the bias transistor 242. The bias boost driver 255 comprises three key components: (1) an boost inverter 257 coupled to receive said boost enable signal 256 and to provide an inverted boost control voltage 258; (2) a cascode boost capacitor 260 coupled between the boost control voltage 258 and the cascode control voltage 234; and (3) a bias boost capacitor 262 coupled between the boost control voltage 258 and the bias control voltage 244. The boost enable signal 256 is controlled by the control circuitry 104.

Regardless whether the bitline 224 is connected or disconnected from the BLSN 230 by the bitline enable (BE) transistor 226, the CS generator 231 is always directly connected to the BLSN 230 by two voltage sources: a clamp voltage (CV) generator 265 and a blacksun voltage (BV) generator 275. The CS generator 231 may be driven by one of the two voltage generators in one embodiment, or both in another embodiment.

The clamp voltage (CV) generator 265 comprises a clamp voltage transistor 266 and a clamp enable transistor 268. The clamp voltage transistor 266 receives the VPIX and provides an adjustable clamp voltage 270 under the control of a clamp control voltage 267. The clamp enable transistor 268, under the control of a clamp enable voltage 269, delivers the adjustable clamp voltage 270 to the CS generator 231 on BLSN 230.

The blacksun voltage (BV) generator 275 comprises a blacksun supply transistor 274, a blacksun transistor 276 and a blacksun enable transistor 278. The blacksun supply transistor 274 provide a blacksun supply voltage to the drain terminal of the blacksun transistor 276 which is guaranteed to be lower than VPIX because the voltage drop between the drain and source terminals of the blacksun supply transistor 274. The blacksun voltage transistor 276 receives the blacksun supply voltage and provides an adjustable blacksun voltage 280 under the control of a blacksun control voltage 277. A blacksun enable transistor 278, under the control of a blacksun enable voltage 279, delivers the adjustable blacksun voltage 280 to the current source generator 231 on BLSN 230.

The adjustable blacksun voltage 280 provides a much higher voltage than the adjustable clamp voltage 270 does on BLSN 230. If VPIX, the highest voltage of the pixel circuit, represents the darkest image boundary which the ADC sees as an upper limit of its converting range, and any normal background signals fall slightly below VPIX, then, the adjustable blacksun voltage 280 is set to be lower than the lowest voltage of those background signals. The blacksun voltage still represents a dark image, and only slightly less dark than those background signals. The purpose of the blacksun voltage generator 275 is explained in paragraph below.

The blacksun voltage is used to avoid the so-called sun eclipse effect (or blacksun effect). That is, when the image sensor is facing the sunlight directly, the supposedly "dark" background at the FD 208 is filled with a lot of electrons either generated directly on the FD (since the FD itself is a photo sensitive substance) or bloomed unstoppably from its surrounding silicone. As a result, this supposedly dark background noise signal is saved as an actual bright signal. After the real bright (plus noise) signal is saved, based on the correlated double sampling (CDS) method, after the ADC, a subtraction of the two saved almost equally "bright" signals induces to a near "zero" final signal, which is equivalent to a black image at the spot where the bright sun should be presented. As can be seen, if left as is, the bright sun becomes a black sun as a result of the subtraction mentioned above—therefore the term "the black sun". To overcome the black sun effect, the adjustable blacksun voltage 280 forces a black level when known background signal (black or near black) is taken during the CDS process. As a result, the sun in the image will no longer be black.

The blacksun control voltage 277 is controlled by the control circuitry 104 based on the feedback on where the level of normal background signals are presented. Once the lowest equivalent voltage (among many normal background signals) is determined by the function logic 108, that value is fed to the control circuitry 104. And then, an updated blacksun control voltage 277 is fed to the BV generator 275 to ensure that the background signals will be "black" enough for the CDS process.

The adjustable clamp voltage 270, in contrast to the adjustable blacksun voltage 280, sets a lowest limit voltage. It represents the brightest image boundary which the ADC sees at the lower end of its converting range.

The control circuit 104 provides all four control signals: the clamp control voltage 267, the clamp enable voltage 269, the blacksun control voltage 277, and the blacksun enable voltage 279, to control the CV generator 265 and the BV generator 275.

An idle voltage (IV) generator 285 serves as a current source to the bitline 224. This IV generator 285 is needed to maintain an idle voltage to the bitline 224 when the bitline 224 is disconnected from its supplying circuits. In one embodiment, when both the RS transistor 220 and the bitline enable transistor 226 are disabled simultaneously, the IV generator 285 becomes the sole power source to charge the floating bitline 224 through its parasitic capacitor Cp 288. The idle voltage is maintained at a closest value to that of the SF source terminal 218 when the gate of the SF 216 is set to a reset FD voltage (VRFD) by the RST transistor 210. The VRFD is a dedicated voltage to reset the floating diffusion controlled by the control circuitry 104. The VRFD may or may not have the same voltage of the VPIX. When the RS transistor 220 is switched on again, voltage at the bitline 224 has been pre-charged to a similar level of the SF source terminal 218; therefore the settling time for the bitline 224 joining the SF 216 is much shortened. That is because when the bitline 224 is reconnected to the SF 216, the voltage difference between the bitline 224 and the SF output 218 is greatly reduced. In one embodiment, the IV generator 285 comprises an idle supply transistor 282 that receives VPIX and provides an idle supply voltage 283 controlled by an idle control voltage (VIDLE), and an idle enable transistor 284 that drives the bitline 224. An idle enable voltage 286 and the VIDLE are controlled by the control circuitry 104.

Figure 3:
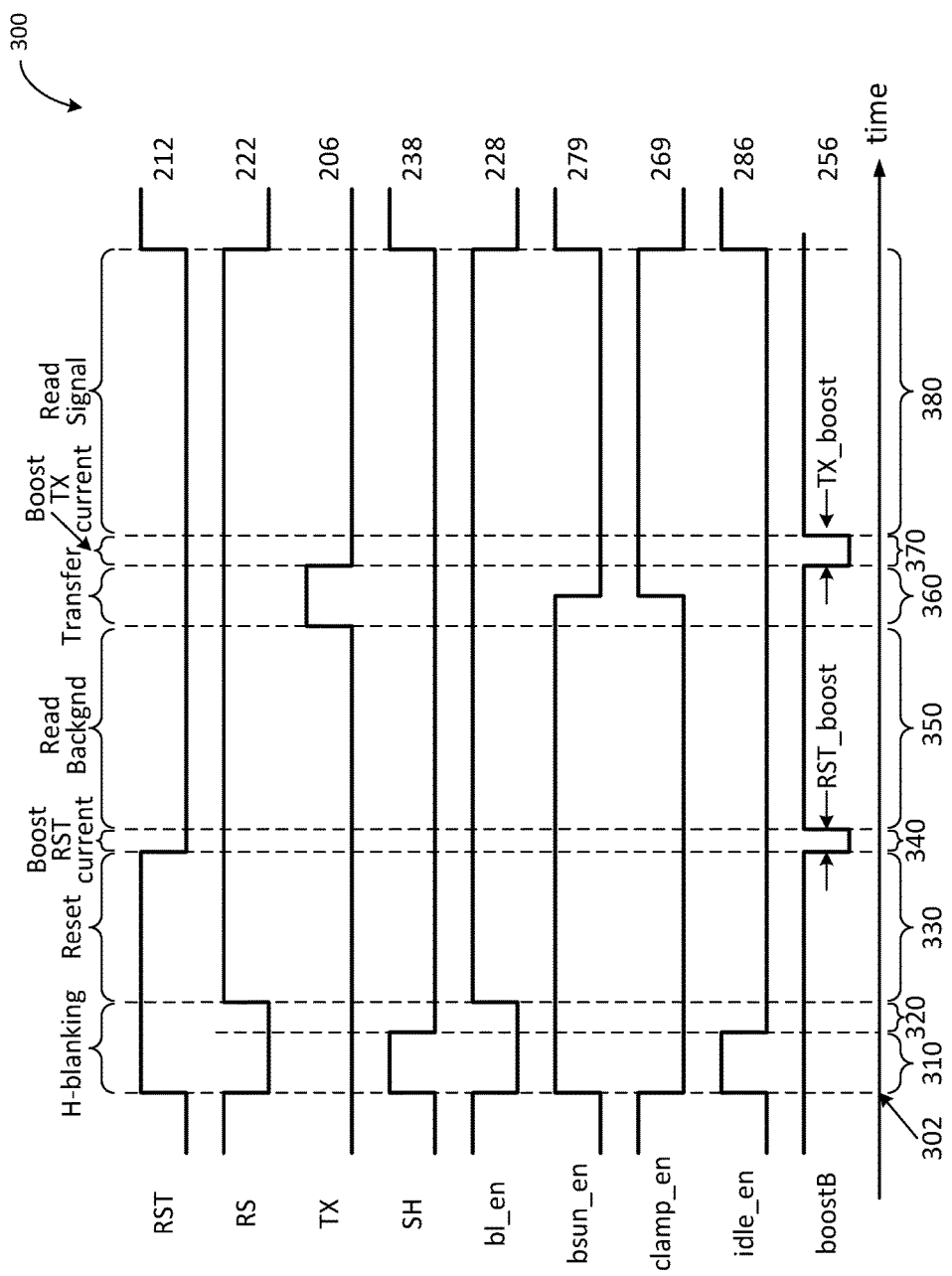
FIG. 3 is an example waveform in association with the operation of the photodiode in an imaging sensor in dealing with bitline settling in accordance with an embodiment of the present disclosure.

FIG. 3 is an illustrative signal readout operation 300 of a pixel cell and its output circuit in an imaging sensor that is capable of fast settling of its output line, the bitline 224, in accordance with an embodiment of the present disclosure. To better understand FIG. 3 and the sequence it represents, a timing flowchart is provided in FIG. 4 to explain all major events that take place in FIG. 3 in conjunction with FIG. 2.

Figure 4:
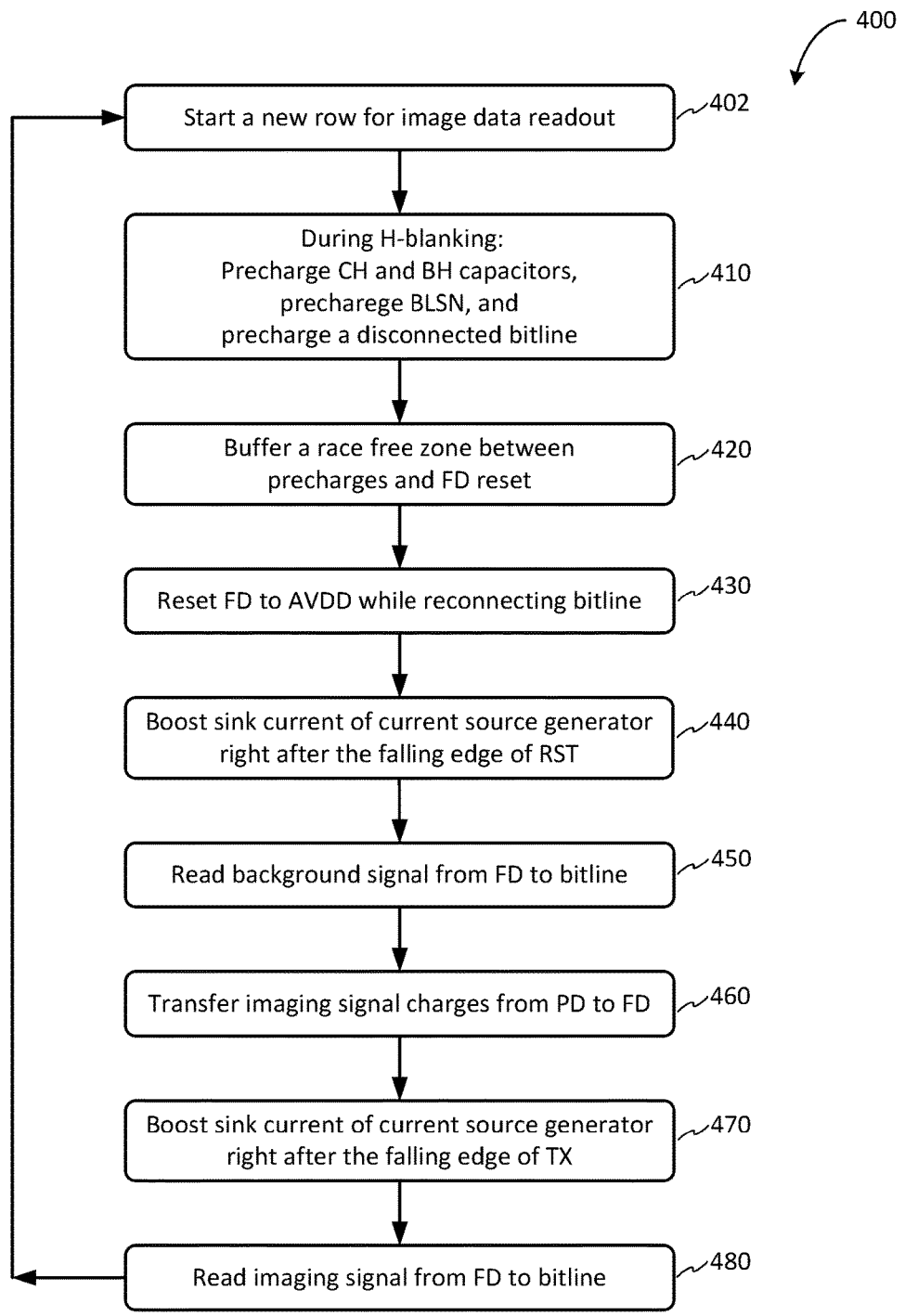
FIG. 4 is an illustrative flow chart in associate with the events of FIG. 3 in accordance with an embodiment of the present disclosure.

FIG. 4 is an illustrative flow chart 400 in accordance with an embodiment of the present disclosure. The flow chart 400 may illustrate a complete cycle of row readout and demonstrates how fast settling on the bitline 224 may be achieved in a typical data readout cycle using the disclosed circuitry 200.

The flow chart 400 begins at time 402 and followed by process block 410. Time 402 (correlated to time point 302 in FIG. 3) marks the beginning of a readout cycle where a new row of a plurality of pixel cells is being read out by the readout circuitry 106. Process block 410 is correlated to the time region 310 shown in FIG. 3. Process block 410 coincides with the Horizontal blanking (H-blanking) for each row of the pixel array 102. H-blanking clears each readout columns 110 of the entire concurrent row, prior to a new readout cycle. Circuit-condition-wise, during block 410, the RST transistor 210 is switched on by the RST gate voltage 212 to reset the FD 208 to the VRFD. Meanwhile, both the RS transistor 220 and the bitline enable resistor 226 are switched off by the RS gate voltage 222 and the bitline enable (bl_en) voltage 228 simultaneously. These switch-offs isolate the bitline 224 from the rest of the driving circuitries except for the IV generator 285 in an embodiment where the RS transistor 220 is connected between the SF transistor 216 and the bitline 224.

Three major pre-charging activities take effect simultaneously during the process block 410 which coincides with the subsequent H-blanking. First of all, for the current source (CS) generator 231, both the cascode enable transistor 236 and the bias enable transistor 246 are enabled by the sample and hold (SH) voltage pulse 238. The CH capacitor 250 is charged to Vcasc 240, and the BH capacitor 252 is charged to Vbias 248. During block 410 when the SH voltage pulse is on, the cascode transistor 232 is driven by Vcl 234, which is driven by Vcasc 240 directly to operate properly; and the bias transistor 242 is driven by Vbl 244, which is driven by Vbias 248 directly to operate properly. Outside of the block 410 when the SH voltage pulse is off, the normal operation of the CS generator 231 between SH pulses is properly maintained by the CH capacitor 250 and the BH capacitor 252, because both bias values Vcl and Vbl that drive the cascode transistor 232 and the bias transistor 242 are properly held by these two capacitors.

Secondly, the clamp voltage (CV) generator 265 is disabled by setting the clamp enable voltage, clamp_en 269, to low. And the blacksun voltage (BV) generator 275 is enabled by setting the blacksun enable voltage, bsun_en 279, to high. The BLSN 230 is charged by the BV generator 275 through the CS generator 231 during this current process block 410.

Thirdly, the idle voltage (IV) generator 285 is enabled by setting the idle enable voltage, idle_en 286, to high. The isolated bitline 224 is charged by the IV generator 285 through the bitline parasitic capacitor Cp 288 to the idle voltage that matches closely to the high voltage value appeared on the SF source voltage 218, since the SF gate, or the FD 208, is set to the VRFD by the RST transistor 210 during this same period.

The IV generator 285 pulls the bitline 224 voltage up to its intended high reset level by using its full current capacity through the parasitic capacitor Cp 288 alone. This shortens the reset settling time of each row, therefore shortening the H-blanking time. As a direct consequence, the readout time for each row is reduced, as well as the overall frame time. Swapping the charging duty from the CV generator 265 to the IV generator 285 at time 302 helps to maintain a stable consumption of the supply power at AVDD, because the bitline 224, as a load circuit, is continuously charged by either the CV generator 265 or the IV generator 285.

Also during the block 410, the boost enable signal (boostB) 256 remains high. As a result, the output of the boost inverter 257 inside the bias boost driver 255, the boost control voltage 258 remains low. It doesn't play any active role yet to control the CS generator 231.

The process block 410 may be followed by process block 420. Process block 420 is correlated to the time region 320 shown in FIG. 3. During block 420, both the SH voltage 238 and the idle enable voltage idle_en 228 are set from high to low. The cascode enable transistor 236, the bias enable transistor 246, and the idle enable transistor 284 are switched from on to off. The time duration of the time region 320 only needs to be long enough to buffer a zone between a first switch action of the SH voltage 238 along with the idle enable voltage idle_en 228 and a second switch action of the RS gate voltage 222 along with the bitline enable voltage bl_en 228, to avoid any race conditions between the first and the second switch actions; and to allow enough time, a few nanosecond, in one embodiment, for the bitline 224 to stabilize.

The process block 420 may be followed by process block 430. Process block 430 is correlated to the time region 330 of FIG. 3. During block 430, the RST gate 212 remains high to keep the RST transistor 210 on. The FD 208 is continuously reset to the VRFD. Block 430 allows enough time for the bitline 224 to stabilize after the bitline 224 has been reconnected to the SF transistor 216 on one side and the BLSN 230 on the other when the RS transistor 220 and the bitline enable transistor 226 are both switched on.

The process block 430 may be followed by process block 440. Process block 440 is correlated to the time region 340 shown in FIG. 3. During block 440, the RST transistor 210 is just turned off by setting the RST gate voltage 212 from high to low (the falling edge of the RST). A background signal on the FD 208 is amplified by the SF transistor 216 and then an amplified background signal is provided to the bitline 224 through the RS transistor 220. During this block period, only the BV generator 275, among all three voltage generators, is enabled by the blacksun enable voltage 279. The blacksun voltage 280 drives both the BLSN 230 and the bitline 224 at the same time since the bitline enable transistor 226 is still closed by the bitline enable bl_en 228. The adjustable blacksun voltage 280 from the BV generator 275 may provide a voltage generally set on the high side which is only slightly lower than the normal background signals. If the VPIX represents the darkest image signal, then, the not-too-much lower blacksun voltage sets a dark enough image signal if not quite the darkest. Appearing to the ADC, if the VPIX represents the lowest value of the ADC outputs, then the blacksun voltage ensures a very low value at the ADC output that is not-too-much higher than the lowest value that the ADC converts within its range.

Also during block 440, the boost enable signal (boostB) 256 to the bias boost driver 255 is toggled off and on right after the RST gate 212 is set from high to low. The boost enable signal (boostB) 256 at the input of the boost inverter 257 of the bias boost driver 255 is toggled off for a RST-boost duration and then back on to generate an inverted on-and-off pulse at the output 258 of the boost inverter 257. This off and an notch signal to the input 256 of the bias boost driver 255 may last the same duration of the time region 340. As a result, this notch wave to the input 256 of the bias boost driver 255 may boost a surge current to the current source generator 231 to sink the BLSN 230 with a large temporary current.

The pulse at the output 258 of the boost inverter 257 drives the cascode control voltage 234 through a cascode boost capacitor 260 to boost the voltage of the cascode control voltage 234 up from the value maintained by the cascode hold capacitor 250 for normal operation to temporarily enable more current to flow through the cascode transistor 232.

The pulse at the output 258 of the boost inverter 257 the bias boost driver 255 drives the bias control voltage 244 through a bias boost capacitor 262 to boost the voltage of the bias control voltage 244 up from the value maintained by the bias hold capacitor 252 for normal operation to temporarily enable more current to flow through the bias transistor 242.

The simultaneous current surge under the control of the off-and-on toggling of the boost enable signal 256 provides a current boost on the current source generator 131. The current surge on the current source generator 131 enables more current on the BLSN 230 to be sunk through the current source generator 131. It is called a RST surge current which flows through the current source generator 231. The RST surge current boosts more temporary current than the normal current provided by the current source generator 231. The RST surge current therefore pulls the feed-through voltage (due to the tunneling effect from the gate terminal to the source terminal of the RST transistor 210) caused by the RST voltage pulse on the bitline 224 down much faster.

The process block 440 may be followed by process block 450. Process block 450 is correlated to the time region 350 shown in FIG. 3. During block 450, as a result of the block 440, voltage disturbance propagated from the FD to the bitline 224 is settled much faster. With a much shorter wait time, after the bitline is settled, the background signal associated with the black image on the FD 208 is read to the bitline 224. The process starts with the background signal on the FD 208 being fed to the SF 216. The SF 216 converts this noise background voltage from its gate terminal 208 to its source terminal 218 as an amplified background signal. The amplified background signal on the SF source terminal 218 is finally read by the bitline 224 through the closed RS transistor 220 in one embodiment, or provided to the bitline 224 directly from the source terminal 218 of the SF transistor 216 in another embodiment. After the analog to digital converter (ADC) which resides in the readout circuitry 106, the digital version of the analog background signal is stored in the readout circuitry 106 for the purpose of the correlated double sampling (CDS) or other digital image processing (DIP) which takes place in the function logic 108.

The process block 450 may be followed by process block 460. Process block 460 is correlated to the time region 360 shown in FIG. 3. During block 460, in one embodiment, photo-generated image signal charges accumulated on the PD 202 are transferred to the FD 208 when the transfer transistor 204 is switched on by the TX gate voltage 206. In another embodiment, the stored charges at the TX receiving terminal 207 transferred by the transfer storage (TS) transistor 203 from the PD 202 is transferred to the FD 208. Both the RS transistor 220 and the bitline enable transistor 226 remain closed. The idle enable transistor 284 remains off. The bitline 224 remains connected to the SF transistor 216 during this process block.

Also during block 460, from the point of view of the BLSN 230, the function of BV generator 275 is taken over by the CV generator 265. The TX transistor 204 is switched off by setting the TX gate voltage 206 to low, the blacksun enable transistor 278 is turned off by setting the blacksun enable 279 to low, and the clamp enable transistor 268 is turned on by setting the clamp enable 269 to high. The swap of the voltage generator from the BV generator 275 to the CV generator 265 continuously maintains stability of the current flow from the BLSN 230 to AGND through the current source generator 231. The total AVDD current shows little variation throughout this block 460. The system power, therefore, remains stable as demanded.

The process block 460 may be followed by process block 470. Process block 470 is correlated to the time region 370 shown in FIG. 3. During block 470, the TX transistor 204 is just turned off by setting the TX gate voltage 206 from high to low (the falling edge of the TX). An image voltage signal on the FD 208 is amplified by the SF transistor 216 and then provided to the bitline 224 through the RS transistor 220. During this block period, only the CV generator 265, among all three voltage generators, is enabled by the clamp enable voltage 269. The clamp voltage 270 sets a limit on the lowest boundary which is equivalent to the brightest signal that appears to the ADC. Although it is not the brightest but close enough so that the ADC may accept it as its input and converts it to serve as its highest value at the ADC output without overflow the ADC. The clamp voltage ensures a lower voltage limit that the ADC is able to handle.

Also during block 470, the boost enable signal (boostB) 256 to the bias boost driver 255 is toggled off and on right after the TX gate voltage 206 is set from high to low. The boost enable signal (boostB) 256 at the input of the boost inverter 257 of the bias boost driver 255 is toggled off for a TX-boost duration and then back on to generate an inverted on-and-off pulse at the output 258 of the boost inverter 257. This off and an notch signal to the input 256 of the bias boost driver 255 may last the same duration of the time region 370. As a result, this notch wave to the input 256 of the bias boost driver 255 may boost a surge current to the current source generator 231 to sink the BLSN 230 with a large temporary current.

Again, the pulse at the output 258 of the boost inverter 257 drives the cascode control voltage 234 through a cascode boost capacitor 260 to boost the voltage of the cascode control voltage 234 up from the value maintained by the cascode hold capacitor 250 for normal operation to temporarily enable more current to flow through the cascode transistor 232.

The pulse at the output 258 of the boost inverter 257 the bias boost driver 255 drives the bias control voltage 244 through a bias boost capacitor 262 to boost the voltage of the bias control voltage 244 up from the value maintained by the bias hold capacitor 252 for normal operation to temporarily enable more current to flow through the bias transistor 242.

The simultaneous current surge under the control of the off-and-on toggling of the boost enable signal 256 provides a current boost on the current source generator 131. The current surge on the current source generator 131 enables more current on the BLSN 230 to be sunk through the current source generator 131. It is called a TX surge current which flows through the current source generator 231. The TX surge current boosts more temporary current than the normal current provided by the current source generator 231. The TX surge current therefore pulls the feed-through voltage (due to the tunneling effect from the gate terminal to the source terminal of the TX transistor 204) caused by the TX voltage pulse on the bitline 224 down much faster.

The process block 470 may be followed by process block 480. Process block 480 is correlated to the time region 380 shown in FIG. 3. During block 480, as a result of the block 470, voltage disturbance propagated from the FD to the bitline 224 is settled much faster. With a much shorter wait time, after the bitline is settled, the image signal on the FD 208 is read to the bitline 224. The process starts with the photo-generated imaging charges on the FD 208 being fed to the SF 216. The SF 216 converts this image signal voltage from its gate terminal 208 to its source terminal 218 as an amplified image signal. The amplified image signal on the SF source terminal 218 is finally read by the bitline 224 through the closed RS transistor 220 in one embodiment, or provided to the bitline 224 directly from the source terminal 218 of the SF transistor 216 in another embodiment. After ADC, the digital version of the analog image signal is stored in the readout circuitry 106 for the purpose of the correlated double sampling (CDS) or other digital image processing (DIP) which takes place in the function logic 108.

The RST-boost duration and the TX-boost duration may or may not have the same time value.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A fast settling output line circuit, comprising: a photodiode (PD) (202) adapted to accumulate image charges in response to incident light; at least one transfer (TX) transistor (204) coupled between the PD (202) and a floating diffusion (FD) (208) to transfer the image charges from the PD (202) to the floating diffusion (FD) (208), wherein a transfer (TX) gate voltage (206) controls transmission of the image charges from a TX receiving terminal (207) of the TX transistor to the FD (208); a reset (RST) transistor (210) coupled to supply a reset FD voltage (VRFD) to the FD (208), wherein a reset (RST) gate voltage (212) controls the RST transistor; a source follower (SF) transistor (216) coupled to receive a voltage of the FD (208) from a SF gate terminal and provide an amplified signal to a SF source terminal (218); a bitline enable transistor (226) coupled to link between a bitline (224) and a bitline source node (BLSN) (230), wherein a bitline enable voltage (228) controls the bitline enable transistor (226); a current source generator (231) coupled to connect between the BLSN (230) and a ground (AGND), wherein the current source generator (231) sinks adjustable current from the BLSN (230) to the AGND through a cascode transistor (232) and a bias transistor (242) controlled by a cascode control voltage (234) and a bias control voltage (244); a cascode hold capacitor (250) coupled between the cascode control voltage (234) and the AGND; a bias hold capacitor (252) coupled between the bias control voltage (244) and the AGND; and a bias boost driver (255) coupled to control the cascode control voltage (234) and the bias control voltage (244).

2. The fast settling output line circuit of claim 1, further comprising a transfer storage (TS) transistor (203) coupled between the PD (202) and the TX transistor (204) to transfer the image charges accumulated in the PD (202) to the TX receiving terminal (207) of the TX transistor, wherein a transfer storage gate (TSG) voltage (206) controls the transfer storage (TS) transistor (203).

3. The fast settling output line circuit of claim 1, further comprising a row select (RS) transistor (220) coupled between the SF source terminal (218) and the bitline (224), wherein a row select (RS) gate voltage (222) controls the RS transistor (220), and wherein the RS transistor (220) passes the amplified signal from the SF source terminal (218) to the bitline (224).

4. The fast settling output line circuit of claim 1, further comprising a row select (RS) transistor (220) coupled between the SF drain terminal and a pixel voltage (VPIX), wherein a row select (RS) gate voltage (222) controls the RS transistor (220), wherein the RS transistor (220) passes the VPIX to the SF drain terminal, and wherein the SF source terminal (218) connects to the bitline (224).

5. The fast settling output line circuit of claim 4, wherein the VPIX connects to a supply voltage AVDD.

6. The fast settling output line circuit of claim 4, wherein the VPIX connects to a regulated voltage supply, wherein the regulated voltage supply is regulated based on the AVDD.

7. The fast settling output line circuit of claim 4, wherein the VPIX and the VRFD have the same value.

8. The fast settling output line circuit of claim 4, wherein the VPIX and the VRFD have different values.

9. The fast settling output line circuit of claim 1, further comprising the bias boost driver (255) coupled to receive a boost enable signal (256) and control the cascode control voltage (234) and the bias control voltage (244) to boost current flowing through the cascode transistor (232) and the bias transistor (242), wherein the bias boost driver (255) comprises:
   a boost inverter (257) coupled to receive the boost enable signal (256) and provide an boost control voltage (258);
   a cascode boost capacitor (260) coupled between the boost control voltage (258) and the cascode control voltage (234); and
   a bias boost capacitor (262) coupled between the boost control voltage (258) and the bias control voltage (244).

10. The fast settling output line circuit of claim 1, wherein the current source generator (231) further comprises: a cascode sample and hold (SH) transistor (236) coupled to receive a cascode voltage (240) and provide the cascode control voltage (234) controlled by a sample and hold (SH) voltage (238); and a bias sample and hold (SH) transistor (246) coupled to receive a bias voltage (248) and provide the bias control voltage (244) controlled by the SH voltage (238).

11. The fast settling output line circuit of claim 1, further comprising a clamp voltage generator (265) configured to receive the VPIX and provide an adjustable clamp voltage (270) to the BLSN (230), wherein the clamp voltage generator (265) comprises:
a clamp transistor (266) configured to receive the VPIX and provide an adjustable clamp voltage (270) controlled by a clamp control voltage (267); and
a clamp enable transistor (268) coupled to pass adjustable clamp voltage (270) to the BLSN (230) controlled by a clamp enable voltage (269).

12. The fast settling output line circuit of claim 11, further comprising a blacksun voltage generator (275) coupled to receive the VPIX and provide an adjustable blacksun voltage (280) to the BLSN (230), wherein the blacksun voltage generator (275) comprises:
a blacksun supply transistor (274) coupled to receive the VPIX and provide a blacksun supply voltage;
a blacksun transistor (276) coupled to receive the blacksun supply voltage and provide an adjustable blacksun voltage (280) controlled by a blacksun control voltage (277); and
a blacksun enable transistor (278) coupled to pass the adjustable blacksun voltage (280) to the BLSN (230) controlled by a blacksun enable voltage (279).

13. The fast settling output line circuit of claim 12, wherein the adjustable blacksun voltage (280) is higher than the adjustable clamp voltage (270).

14. The fast settling output line circuit of claim 1, further comprising an idle voltage generator (285) coupled to receive the VPIX and provide an idle voltage to the bitline (224), wherein the idle voltage generator (285) comprises:
an idle supply transistor (282) configured to receive the VPIX and provide an idle supply voltage (283) controlled by an idle control voltage (VIDLE); and
an idle enable transistor (284) coupled to pass the idle supply voltage (283) to the bitline (224) controlled by an idle enable voltage (286).

15. The fast settling output line circuit of claim 1, further comprising a transmission gate (290) passing the amplified signal from the bitline (224) to an ADC input (292).

16. A method of fast settling an output line circuit, comprising: resetting a floating diffusion (FD) (208) to a reset FD voltage (VRFD) by setting a reset (RST) gate (212) to high to switch on a reset (RST) transistor (210); precharging a bitline (224) through a bitline parasitic capacitor (288) to a SF source reset voltage by setting an idle enable voltage (286) to high to turn on an idle enable transistor (284), when a row select (RS) transistor (220) and a bitline enable transistor (226) are switched off; precharging a cascode hold capacitor (250) to a cascode voltage (240) and a bias hold capacitor (252) to a bias voltage (248) by setting a sample and hold (SH) voltage (238) to high to turn on a cascode hold transistor (236) and a bias hold transistor (246); precharging a bitline source node (BLSN) (230) to a blacksun voltage by setting a blacksun enable voltage (279) to high to turn on a blacksun enable transistor (278) and by providing a blacksun control voltage (277) to a blacksun transistor (276), and turning off a clamp enable transistor (268) by setting a clamp enable voltage (269) to low; maintaining a high voltage to a boost enable signal (256) at the input of a boost inverter (257) to maintain a low voltage to a boost control voltage (258) at the output of the boost inverter (257); discontinuing precharging to: (i) the bitline capacitor (288), (ii) the cascode hold capacitor (250), and (iii) the bias hold capacitor (252) by setting the idle enable voltage (286) to low to turn off the idle enable transistor (284) and by setting a sample and hold (SH) voltage (238) to low to turn off both the cascode hold transistor (236) and the bias hold transistor (246); enabling a SF source terminal (218) to the bitline (224) and reconnecting the bitline (224) to the BLSN (230) by setting both the RS gate voltage (222) and bitline enable voltage (228) to high to close the RS transistor (220) and the bitline enable transistor (226); disconnecting the FD (208) from a pixel voltage (VPIX) by setting the RST gate voltage (212) to low to switch off the RST transistor (210); and toggling off and on the boost enable signal (256) at the input of the boost inverter (257) to boost a RST settling surge current through the current source generator (231) to sink the BLSN (230) with a large temporary current right after the RST gate voltage (212) drops from high to low, wherein the boost enable signal (256) at the input of the boost inverter (257) is toggled off for a RST-boost duration and then toggled on to generate an on-and-off RST settling pulse at the output (258) of the boost inverter (257), wherein the on-and-off RST settling pulse at the output (258) of the boost inverter (257) drives the cascode control voltage (234) through a cascode boost capacitor (260) to boost the voltage of the cascode control voltage (234) up from the value maintained by the cascode hold capacitor (250) to temporarily enable more current to flow through the cascode transistor (232), wherein the on-and-off RST settling pulse at the output (258) of the boost inverter (257) drives the bias control voltage (244) through a bias boost capacitor (262) to boost the voltage of the bias control voltage (244) up from the value maintained by the bias hold capacitor (252) to temporarily enable more current to flow through the bias transistor (242), wherein the on-and-off RST settling pulse at the output (258) controlled by the off-and-on toggling of the boost enable signal (256) provides the RST settling surge current on the current source generator (131), and wherein the RST settling surge current on the current source generator (131) enables more current on the BLSN (230) to be sunk through the current source generator (131).

17. The method of claim 16, further comprising reading a background signal on the FD (208), wherein the SF transistor (216) receives the background signal at a SF gate terminal (208) and provides an amplified background signal at a SF source terminal (218), and wherein an ADC receives the amplified background signal from the bitline (224) to an ADC input terminal (292).

18. The method of claim 17, wherein the RS transistor (220) passes the amplified background signal to the bitline (224) when the RS transistor (220) is closed by the RS gate voltage (222).

19. The method of claim 17, wherein the amplified background signal flows to the bitline (224).

20. The method of claim 17, further comprising transferring image charges accumulated from the TX receiving terminal (207) of the TX transistor to the FD (208) by switching a transfer (TX) transistor (204) on and off with a toggle of a TX gate voltage (206).

21. The method of claim 20, further comprising toggling off and on the boost enable signal (256) at the input of the boost inverter (257) to boost a TX settling surge current through the current source generator (231) to sink the BLSN (230) with a large temporary current right after the TX gate voltage (206) drops from high to low, wherein the boost enable signal (256) at the input of the boost inverter (257) is toggled off for a TX-boost duration and then toggled on to generate an on-and-off TX settling pulse at the output (258)

of the boost inverter (257), wherein the on-and-off TX settling pulse at the output (258) of the boost inverter (257) drives the cascode control voltage (234) through a cascode boost capacitor (260) to boost the voltage of the cascode control voltage (234) up from the value maintained by the cascode hold capacitor (250) to temporarily enable more current to flow through the cascode transistor (232), wherein the on-and-off TX settling pulse at the output (258) of the boost inverter (257) drives the bias control voltage (244) through a bias boost capacitor (262) to boost the voltage of the bias control voltage (244) up from the value maintained by the bias hold capacitor (252) to temporarily enable more current to flow through the bias transistor (242), wherein the on-and-off TX settling pulse at the output (258) controlled by the off-and-on toggling of the boost enable signal (256) provides TX settling surge current on the current source generator (131), and wherein the TX settling surge current on the current source generator (131) enables more current on the BLSN (230) to be sunk through the current source generator (131).

22. The method of claim 20, wherein during the period the TX transistor (204) is switched off by setting the TX gate voltage (206) to low, the blacksun enable transistor (278) is turned off by setting the blacksun enable voltage (279) to low, and the clamp enable transistor (268) is turned on by setting the clamp enable voltage (269) to high.

23. The method of claim 20, wherein the SF transistor (216) amplifies the image signal from the FD (208) to an amplified image signal on a SF source terminal (218), and wherein the ADC receives the amplified image signal at the ADC input terminal (292).

24. The method of claim 23, wherein the RS transistor (220) passes the amplified image signal to the bitline (224) when the RS transistor (220) is closed by the RS gate voltage (222).

25. The method of claim 23, wherein the amplified image signal flows to the bitline (224).

26. The method of claim 23, wherein a transmission gate (290) passes the amplified image signal from the bitline (224) to the ADC input terminal (292) by enabling the transmission gate (290).

27. The method of claim 16, wherein a voltage provided by the blacksun enable transistor (276) is higher than the voltage provided by the clamp enable transistor (268) to BLSN (230).

28. The method of claim 16, wherein the SF source reset voltage is a voltage value of the SF source terminal (218) when the FD (208) is reset though the RST transistor (210) to the VRFD.

29. A fast settling imaging system (100), comprising:
a pixel array (102) of pixel cells, wherein each one of the pixel cell (201) includes:
  a photodiode (PD) (202) adapted to accumulate image charges in response to incident light;
  at least one transfer (TX) transistor (204) coupled between the PD (202) and a floating diffusion (FD) (208) to transfer the image charges from the PD (202) to the floating diffusion (FD) (208), wherein a transfer (TX) gate voltage (206) controls the transmission of the image charges from a TX receiving terminal (207) of the TX transistor to the FD (208);
  a reset (RST) transistor (210) coupled to supply a reset FD voltage (VRFD) to the FD (208), wherein a reset (RST) gate voltage (212) controls the RST transistor; and
  a source follower (SF) transistor (216) coupled to receive voltage of the FD (208) from a SF gate terminal and provide an amplified signal to a SF source terminal (218);
  a bitline enable transistor (226) coupled between the bitline (224) and a bitline source node (BLSN) (230), wherein a bitline enable voltage (228) controls the bitline enable transistor;
  a current source generator (231) coupled to connect between the BLSN (230) and a ground (AGND), wherein the current source generator (231) sinks adjustable current from the BLSN (230) to the AGND through a cascode transistor (232) and a bias transistor (242) under the control of a cascode control voltage (234) and a bias control voltage (244), wherein the current source generator (231) temporarily sinks an excessive current under the control of a bias boost driver (255);
  a control circuitry (104) coupled to the pixel array (102) to control operation of the pixel array (102), wherein the control circuitry (104) provides the TX gate voltage (206), the RST gate voltage (212), the RS gate voltage (222), the bitline enable voltage (228), a sample and hold (SH) voltage (238), a cascode voltage (240), a bias voltage (248), a boost enable signal (256), a clamp control voltage (267), a clamp enable voltage (269), a blacksun control voltage (277), a blacksun enable voltage (279), an idle control voltage (VIDLE), and an idle enable voltage (286);
  a readout circuitry (106) coupled to the pixel array (102) through a plurality of readout columns (110) to readout image data from the plurality of pixels; and
  a function logic (108) coupled to receive image data from the readout circuitry (106) to store the image data from each one of the plurality of pixel cells, wherein the function logic (108) provides instructions to the control circuitry (104).

30. The fast settling imaging system of claim 29, further comprising a transfer storage (TS) transistor (203) coupled between the PD (202) and the TX transistor (204) to transfer the image charges accumulated in the PD (202) to the TX receiving terminal (207) of the TX transistor, wherein a transfer storage gate (TSG) voltage (206) controls the TS transistor (203).

31. The fast settling imaging system of claim 29, further comprising a row select (RS) transistor (220) coupled between the SF source terminal (218) and the bitline (224), wherein a row select (RS) gate voltage (222) controls the RS transistor (220), and wherein the RS transistor (220) passes the amplified signal from the SF source terminal (218) to the bitline (224).

32. The fast settling imaging system of claim 29, further comprising a row select (RS) transistor (220) coupled between the SF drain terminal and a pixel voltage (VPIX), wherein a row select (RS) gate voltage (222) controls the RS transistor (220), wherein the RS transistor (220) passes the VPIX to the SF drain terminal, and wherein the SF source terminal (218) connects to the bitline (224).

33. The fast settling imaging system of claim 32, wherein the VPIX connects to a supply voltage AVDD.

34. The fast settling imaging system of claim 32, wherein the VPIX connects to a regulated voltage supply, wherein the regulated voltage supply is regulated based on the AVDD.

35. The fast settling imaging system of claim 32, wherein the VPIX and the VRFD have the same value.

36. The fast settling imaging system of claim 32, wherein the VPIX and the VRFD have different values.

37. The fast settling imaging system of claim 29, further comprising the bias boost driver (255) coupled to receive a boost enable pules and provide boost voltages to the cascode transistor (232) and the bias transistor (242), wherein the bias boost driver (255) comprises:
- a boost inverter (257) coupled to receive a boost enable signal (256) and provide a boost control voltage (258);
- a cascode boost capacitor (260) coupled between the boost control voltage (258) and the cascode control voltage (234); and
- a bias boost capacitor (262) coupled between the boost control voltage (258) and the bias control voltage (244).

38. The fast settling imaging system of claim 29, wherein the current source generator (231) further comprises:
- a cascode sample and hold (SH) transistor (236) coupled to receive the cascode voltage (240) and provide the cascode control voltage (234) controlled by the SH voltage (238);
- a bias sample and hold (SH) transistor (246) coupled to receive the bias voltage (248) and provide the bias control voltage (244) controlled by the SH voltage (238);
- a cascode hold capacitor (250) coupled between the cascode control voltage (234) and the AGND; and
- a bias hold capacitor (252) coupled between the bias control voltage (244) and the AGND.

39. The fast settling imaging system of claim 29, further comprising a clamp voltage generator (265) configured to receive the VPIX and provide an adjustable clamp voltage to the BLSN (230), wherein the clamp voltage generator (265) comprises:
- a clamp transistor (266) configured to receive the VPIX and provide an adjustable clamp voltage (270) controlled by the clamp control voltage (267); and
- a clamp enable transistor (268) coupled to pass the adjustable clamp voltage (270) to the BLSN (230) controlled by the clamp enable voltage (269).

40. The fast settling imaging system of claim 29, further comprising a blacksun voltage generator (275) configured to receive the VPIX and provide an adjustable blacksun voltage (280) to the BLSN (230), wherein the adjustable blacksun voltage (280) is higher than the adjustable clamp voltage (270), wherein the blacksun voltage generator (275) comprises:
- a blacksun supply transistor (274) configured to receive the VPIX and provide a blacksun supply voltage;
- a blacksun transistor (276) coupled to receive the blacksun supply voltage and provide an adjustable blacksun voltage (280) controlled by the blacksun control voltage (277); and
- a blacksun enable transistor (278) coupled to pass the adjustable blacksun voltage (280) to the BLSN (230) controlled by the blacksun enable voltage (279).

41. The fast settling imaging system of claim 29, further comprising an idle voltage generator (285) configured to receive the VPIX and provide an idle voltage to the bitline (224), wherein the idle voltage generator (285) comprises:
- an idle supply transistor (282) configured to receive the VPIX and provide an idle supply voltage (283) controlled by an idle control voltage (VIDLE); and
- an idle enable transistor (284) coupled to pass the idle supply voltage (283) to the bitline (224) controlled by an idle enable voltage (286).

42. The fast settling imaging system of claim 29, further comprising a transmission gate (290) passing the amplified signal from the bitline (224) to an ADC input (292).

* * * * *